(12) United States Patent
Goto

(10) Patent No.: US 10,135,360 B2
(45) Date of Patent: Nov. 20, 2018

(54) POWER CONVERTER

(71) Applicant: Panasonic Intellectual Property Management Co., Ltd., Osaka (JP)

(72) Inventor: Shusaku Goto, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/870,465

(22) Filed: Jan. 12, 2018

(65) Prior Publication Data
US 2018/0138827 A1 May 17, 2018

Related U.S. Application Data

(63) Continuation of application No. PCT/JP2016/003690, filed on Aug. 10, 2016.

(30) Foreign Application Priority Data

Aug. 28, 2015 (JP) .................................. 2015-169197

(51) Int. Cl.
*H02M 1/088* (2006.01)
*H02M 7/521* (2006.01)
(Continued)

(52) U.S. Cl.
CPC ............. *H02M 7/521* (2013.01); *H02M 1/08* (2013.01); *H02M 1/38* (2013.01); *H02M 7/5387* (2013.01);
(Continued)

(58) Field of Classification Search
CPC . H02M 2001/0038; H02M 2001/0006; H02M 2001/126; H02M 2001/38;
(Continued)

(56) References Cited

U.S. PATENT DOCUMENTS

2004/0017227 A1   1/2004  Hiyama
2012/0081058 A1*  4/2012  Bortolus ............. H02K 11/001
                                                318/490
(Continued)

FOREIGN PATENT DOCUMENTS

EP   3029821 A1     6/2016
JP   2006-254583    9/2006
JP   2015 033217 A  2/2015

OTHER PUBLICATIONS

Extended European Search Report for corresponding App. No. 16841063.7, dated Jun. 7, 2018.

*Primary Examiner* — Jeffrey Gblende
*Assistant Examiner* — David A. Singh
(74) *Attorney, Agent, or Firm* — Renner, Otto, Boisselle & Sklar, LLP

(57) ABSTRACT

A third power supply circuit subjects a reference voltage to DC-DC conversion to generate a power supply voltage common to a second driver circuit for driving a second switching device and a fourth driver circuit for driving a fourth switching device. Wirings from a substrate on which the third power supply circuit is provided to a substrate on which the second driver circuit and the fourth driver circuit are provided are used by the third power supply circuit to supply the power supply voltage commonly to the second driver circuit and the fourth driver circuit. A first impedance device, a second impedance device, a third impedance device, and a fourth impedance device are provided in a substrate on which the second driver circuit and the fourth driver circuit are provided.

4 Claims, 7 Drawing Sheets

(51) Int. Cl.
|   |   |
|---|---|
| *H02M 1/08* | (2006.01) |
| *H02M 1/38* | (2007.01) |
| *H02M 7/5387* | (2007.01) |
| *H03K 17/082* | (2006.01) |
| *H03K 17/16* | (2006.01) |
| *H02M 1/12* | (2006.01) |
| *H02M 1/00* | (2006.01) |

(52) U.S. Cl.
CPC ....... *H03K 17/0828* (2013.01); *H03K 17/168* (2013.01); *H02M 1/088* (2013.01); *H02M 1/126* (2013.01); *H02M 2001/0006* (2013.01); *H02M 2001/0038* (2013.01); *H03K 2217/0081* (2013.01)

(58) Field of Classification Search
CPC ................ H02M 7/521; H02M 7/5387; H03K 17/0828; H03K 17/168; H03K 2217/081
See application file for complete search history.

(56) References Cited

U.S. PATENT DOCUMENTS

| | | | | |
|---|---|---|---|---|
| 2013/0328514 | A1* | 12/2013 | Funaba | H02P 27/08 318/519 |
| 2014/0375292 | A1* | 12/2014 | Kihara | H02M 1/08 323/283 |
| 2016/0226392 | A1* | 8/2016 | Kato | H02M 7/003 |
| 2016/0308454 | A1* | 10/2016 | Kawai | H02M 5/45 |
| 2016/0329823 | A1* | 11/2016 | Nakamura | H02M 3/33561 |

* cited by examiner

POWER CONVERTER

CROSS-REFERENCE TO RELATED APPLICATIONS

This application is a Continuation of International Application No. PCT/JP2016/003690, filed on Aug. 10, 2016, which in turn claims the benefit of Japanese Application No. 2015-169197, filed on Aug. 28, 2015, the disclosures of which application are incorporated by reference herein.

BACKGROUND

1. Field of the Invention

The present invention relates to power converter that convert a DC power into an AC power.

2. Description of the Related Art

In many of the power converters for converting a DC power into an AC power, an inverter circuit using a bridge circuit is used. A bridge circuit is configured to generate an AC power by connecting a series connection of two or three switching devices (arms) in parallel between a high-side reference line and a low-side reference line that are connected to a DC power supply and allowing the switching devices to operate in a complementary manner. For example, an Insulated Gate Bipolar Transistor (IGBT), a Metal-Oxide-Semiconductor Field Transistor (MOSFET), or the like is used as the switching devices. The switching devices are driven by respective driver circuits.

The emitters of the switching devices on the lower side of each arm share a common potential. Therefore, a common power supply circuit can be used for a plurality of driver circuits that respectively drive the switching devices on the lower side (see, patent document 1).

[patent document 1] JP2006-254583

As the switching speed of the switching devices increases, however, the potential difference between the emitters of the switching devices on the lower side produced by the impact from parasitic impedance between the emitters grows. The potential difference induces an instantaneous current between the emitters, causing the gate potential of the switching devices on the lower side to vary, which causes the switching devices on the lower side to perform a false switching operation.

SUMMARY OF THE INVENTION

In this background, a purpose of one aspect of the present invention is to provide a power converter in which a common power supply circuit is used for the driver circuits for the switching devices on the lower side of the inverter circuit, while also inhibiting a false operation.

A power converter of one aspect of the present invention comprises: an inverter circuit including a first arm and a second arm connected in parallel and converting a DC power into an AC power, the first arm including a first switching device and a second switching device connected in series, the second arm including a third switching device and a fourth switching device connected in series; a first power supply circuit that subjects a reference voltage to DC-DC conversion to generate a power supply voltage for a first driver circuit for driving the first switching device; a second power supply circuit that subjects the reference voltage to DC-DC conversion to generate a power supply voltage for a third driver circuit for driving the third switching device; a third power supply circuit that subjects the reference voltage to DC-DC conversion to generate a power supply voltage common to a second driver circuit for driving the second switching device and a fourth driver circuit for driving the fourth switching device. Wirings from a substrate on which the third power supply circuit is provided to a substrate on which the second driver circuit and the fourth driver circuit are provided are used by the third power supply circuit to supply the power supply voltage commonly to the second driver circuit and the fourth driver circuit, the substrate on which the second driver circuit and the fourth driver circuit are provided includes: a positive side branch node of the wirings; a negative side branch node of the wirings; a first impedance device connected to the positive side branch node and a positive side power supply terminal of the second driver circuit; a second impedance device connected to the negative side branch node and a negative side power supply terminal of the second driver circuit; a third impedance device connected to the positive side branch node and a positive side power supply terminal of the fourth driver circuit; and a fourth impedance device connected to the negative side branch node and a negative side power supply terminal of the fourth driver circuit.

Optional combinations of the aforementioned constituting elements, and implementations of the invention in the form of methods, apparatuses, and systems may also be practiced as additional modes of the present invention.

BRIEF DESCRIPTION OF THE DRAWINGS

The figures depict one or more implementations in accordance with the present teaching, by way of example only, not by way of limitations. In the figures, like reference numerals refer to the same or similar elements.

DETAILED DESCRIPTION

One aspect of the invention will now be described by reference to the preferred embodiments. This does not intend to limit the scope of the present invention, but to exemplify the invention.

Figure 1:
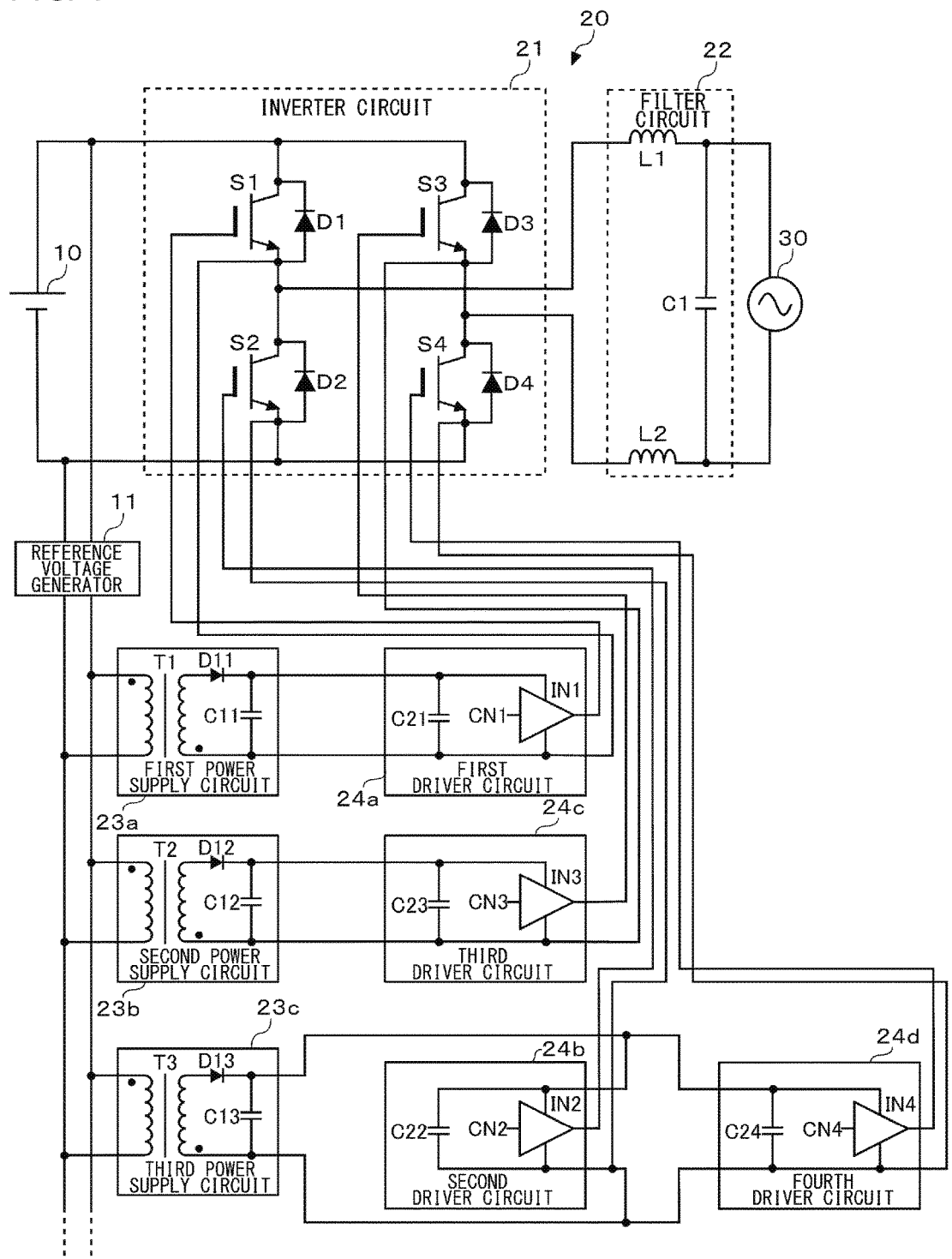
FIG. 1 shows a configuration of a power converter according to comparative example 1.

FIG. 1 shows a configuration of a power converter 20 according to comparative example 1. The power converter 20 converts a DC power supplied from a DC power supply 10 into an AC power and feeds a reverse power flow to a system 30. An AC load may be connected in place of the system 30. The DC power supply 10 is, for example, a solar cell or a fuel cell. In that case, the power converter 20 functions as a power conditioner that converts a DC power generated by the solar cell or the fuel cell into an AC power.

In the following example, the DC power supply 10 is assumed to be a photovoltaic power generation system outputting 300~450 V.

An inverter circuit 21 converts the DC power supplied from the DC power supply 10 into an AC power. FIG. 1 shows an example in which the inverter circuit 21 is implemented by a full-bridge circuit. The full-bridge circuit includes a first arm and a second arm across the ends of the DC power supply 10, where the first arm includes a first switching device S1 and a second switching device S2 connected in series, the second arm includes a third switching device S3 and a fourth switching device S4 connected in series, and the first arm and the second arm are connected in parallel. The AC power is output from the middle point of the first arm and the middle point of the second arm.

For example, an IGBT can be used as the first switching device S1~fourth switching device S4. The collector terminal of the first switching device S1 and the collector terminal of the third switching device S3 are connected to the high-side reference line connected to the positive terminal of the DC power supply 10. The emitter terminal of the second switching device S2 and the emitter terminal of the fourth switching device S4 are connected to the low-side reference line connected to the negative terminal of the DC power supply 10. The emitter terminal of the first switching device S1 and the collector terminal of the second switching device S2 are connected, and the emitter terminal of the third switching device S3 and the collector terminal of the fourth switching device S4 are connected.

First feedback diode D1~fourth feedback diode D4 are connected in parallel with the first switching device S1~fourth switching device S4, respectively, in a backward direction. A Metal-Oxide-Semiconductor Field-Effect Transistor (MOSFET) may be used as the first switching device S1~fourth switching device S4. In this case, a parasitic diode formed in the direction from the source to the drain can be used as the first feedback diode D1~fourth feedback diode D4.

A filter circuit 22 includes a first reactor L1, a second reactor L2, and a capacitor C1. The filter circuit 22 attenuates high-frequency components in the AC power output from the inverter circuit 21 so as to approximate the output voltage and output current of the inverter circuit 21 to sinusoidal waves. The AC power output from the filter circuit 22 is fed as a reverse power flow to the system 30.

A reference voltage generator 11 subjects the DC voltage of the DC power supply 10 to DC-DC conversion so as to generate a reference voltage. In this example, the DC voltage of 300~450 V is stepped down to generate a DC voltage of 24V. The reference voltage is a voltage that originates a power supply voltage or a reference voltage used in various circuits in the power converter 20. FIG. 1 shows an example of generating the reference voltage from the DC power supply 10, but the source of supplying power to the reference voltage generator 11 is non-limiting. The commercial voltage supplied from the system 30 may be subject to AC-DC conversion, or the reference voltage may be generated from another DC power supply.

A first power supply circuit 23a subjects the reference voltage to DC-DC conversion to generate a power supply voltage for a first driver circuit 24a. A second power supply circuit 23b subjects the reference voltage to DC-DC conversion to generate a power supply voltage for a third driver circuit 24c. A third power supply circuit 23c subjects the reference voltage to DC-DC conversion to generate a power supply voltage common to a second driver circuit 24b and a fourth driver circuit 24d.

The first power supply circuit 23a includes an insulated DC-DC converter that steps down the reference voltage. The insulated DC-DC converter includes a transformer T1, a rectifying diode D11 and a capacitor C11. The transformer T1 steps down the reference voltage according to a predetermined winding ratio. In this example, the transformer T1 steps down the DC voltage of 24 V to generate a DC voltage of 15 V. The voltage on the secondary side of the transformer T1 is shaped by the rectifying diode D11 and the capacitor C11 and is output accordingly. The configuration of the second power supply circuit 23b and the third power supply circuit 23c are similar to the configuration of the first power supply circuit 23a.

The first driver circuit 24a generates a driving voltage to drive the first switching device S1 in accordance with a control signal CN1 for the first switching device S1. The second driver circuit 24b generates a driving voltage to drive the second switching device S2 in accordance with a control signal CN2 for the second switching device S2. The third driver circuit 24c generates a driving voltage to drive the third switching device S3 in accordance with a control signal CN3 for the third switching device S3. The fourth driver circuit 24d generates a driving voltage to drive the fourth switching device S4 in accordance with a control signal CN4 for the fourth switching device S4.

The first driver circuit 24a includes a first inverter IN1 and a capacitor C21. A power supply voltage generated by the first power supply circuit 23a is applied between the positive side power supply terminal and the negative side power supply terminal of the inverter IN1. The capacitor C21 stabilizes the voltage between the positive side power supply terminal and the negative side power supply terminal of the inverter IN1. The output terminal of the inverter IN1 is connected to the gate terminal of the first switching device S1, and the negative side power supply terminal of the inverter IN1 is connected to the emitter terminal of the first switching device S1.

For example, the inverter IN1 is formed by a series circuit of a p-channel transistor (upper transistor) and an n-channel transistor (lower transistor). The control signal CN1 (e.g., a PWM signal) for the first switching device S1 is input to the gate terminals of the p-channel transistor and the n-channel transistor from a control circuit (not shown). In this example, when the control signal CN1 is high, the inverter IN1 outputs a low level (0 V) to the gate terminal of the first switching device S1. When the control signal CN1 is low, the inverter IN1 outputs a high level (15 V) to the gate terminal of the first switching device S1.

The second driver circuit 24b, the third driver circuit 24c, and the fourth driver circuit 24d are configured similarly as the first driver circuit 24a. The control circuit (not shown) regulates the duty ratio of the control signals CN1~CN4 so that the output current of the power converter 20 matches a target current value. By increasing the duty ratio of the control signals CN1~CN4, the output power of the inverter circuit 21 is increased. By decreasing the duty ratio of the control signals CN1~CN4, the output power of the inverter circuit 21 is decreased.

Figure 2:
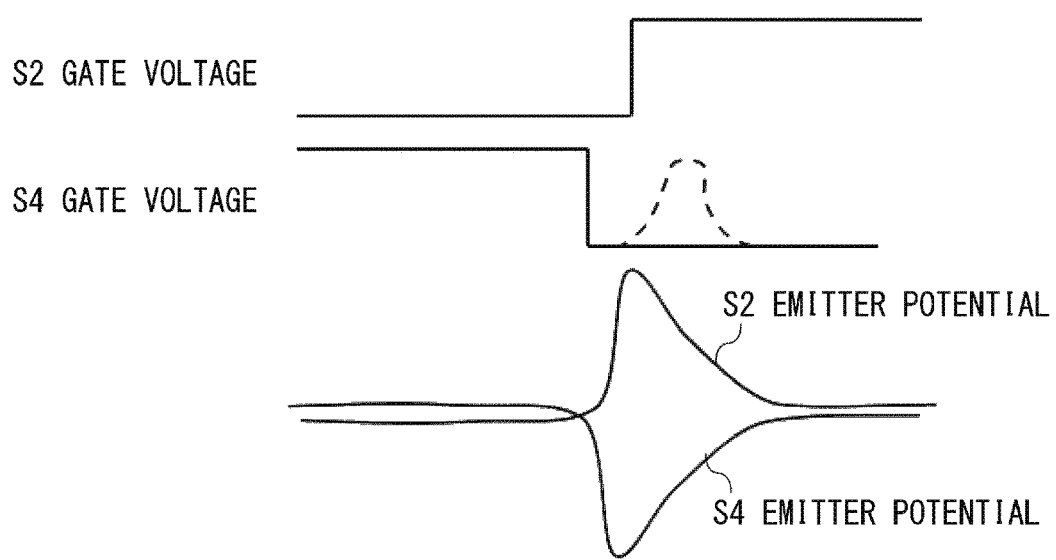
FIG. 2 is a graph showing a false operation that could occur in the second switching device and the fourth switching device of FIG. 1.

FIG. 2 is a graph showing a false operation that could occur in the second switching device S2 and the fourth switching device S4 of FIG. 1. In the configuration of FIG. 1, the second driver circuit 24b and the fourth driver circuit 24d share a common power supply so that the emitter terminal of the second switching device S2 is electrically connected to the emitter terminal of the fourth switching device S4 via the negative side wiring of the inverter IN2 and the negative side wiring of the inverter IN4.

FIG. 2 shows an example of transition of the gate potential and emitter potential of the second switching device S2 and the fourth switching device S4 that occurs when the fourth switching device S4 is turned off while the second switching device S2 is off and the fourth switching device S4 is on, a dead time is interposed, and the second switching device S2 is turned on.

When the fourth switching device S4 is turned off and the second switching device S2 is turned on, an instantaneous current flows from the emitter of the second switching device S2 to the emitter of the fourth switching device S4 due to the inductance component parasitic to the emitter of the fourth switching device S4 and the inductance component parasitic to the emitter of the second switching device S2. This increases the gate voltage of the fourth switching device S4 turned off. When the gate voltage exceeds a threshold value, an unintended turn-on (false operation) occurs. A measures to prevent this false operation will be discussed.

Figure 3:
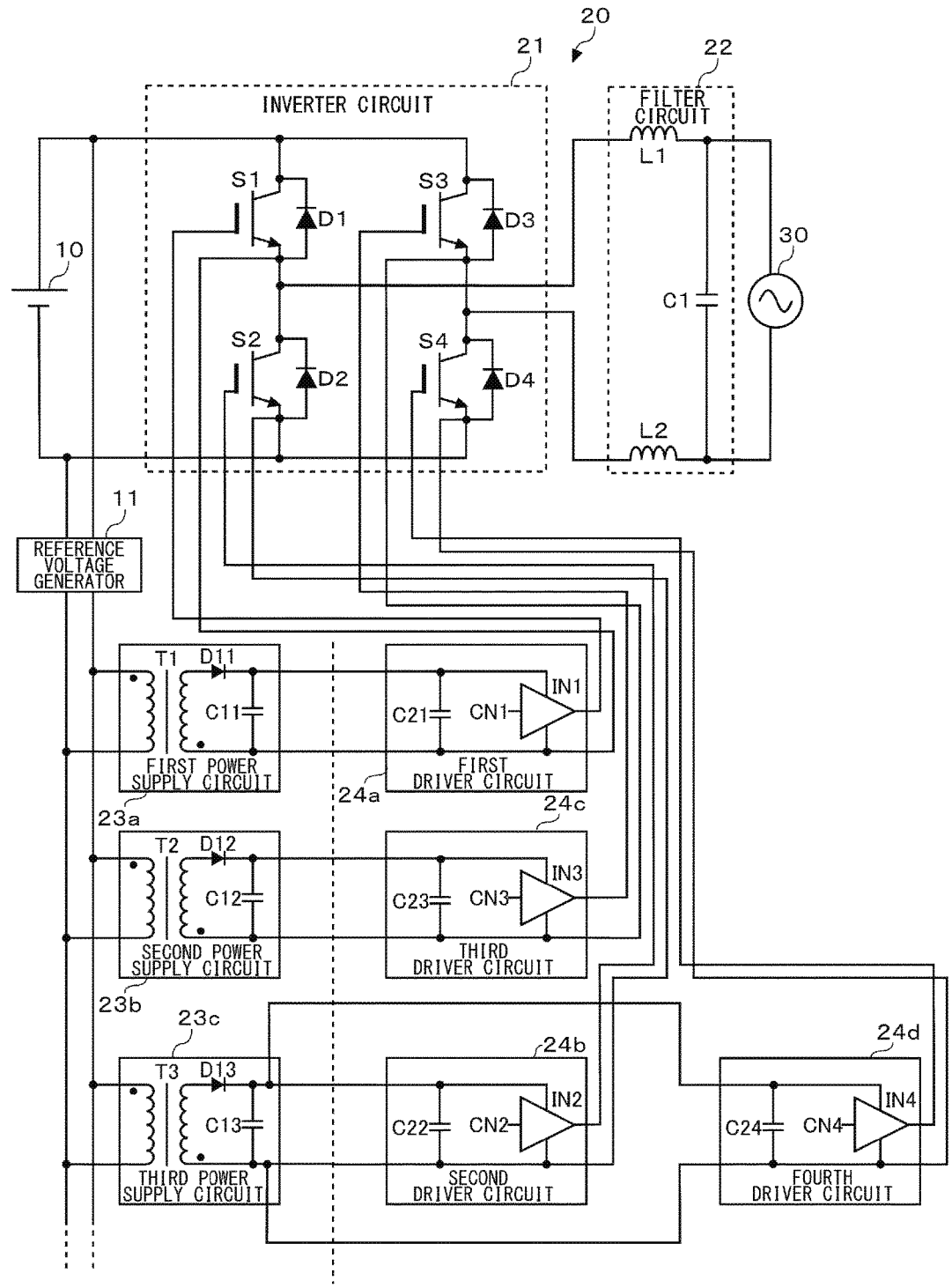
FIG. 3 shows a configuration of the power converter according to comparative example 2.

FIG. 3 shows a configuration of the power converter 20 according to comparative example 2. A description of those features that are common to those of comparative example 1 will be omitted. In comparative example 2, positive and negative windings are provided from the third power supply circuit 23c to the second driver circuit 24b and the fourth driver circuit 24d individually. This increases the impedance of the wiring connecting the emitter terminal of the second switching device S2 and the emitter terminal of the fourth switching device S4 and so reduces the instantaneous current caused by a potential difference between the emitters. Further, the negative potentials of the second driver circuit 24b and the fourth driver circuit 24d can vary independently over a larger range. Accordingly, the emitter potential of the second switching device S2 and the negative potential of the second driver circuit 24b can match each other easily, and the emitter potential of the fourth switching device S4 and the negative potential of the fourth driver circuit 24d can match each other easily so that it is difficult for a false operation to occur.

However, the configuration of comparative example 2 requires more numerous wiring patterns so that the circuit scale is increased. If the substrate on which the third power supply circuit 23c is mounted and the substrate on which the second driver circuit 24b and the fourth driver circuit 24d are mounted are separate, the number of wirings across the substrates will be increased.

Figure 4:
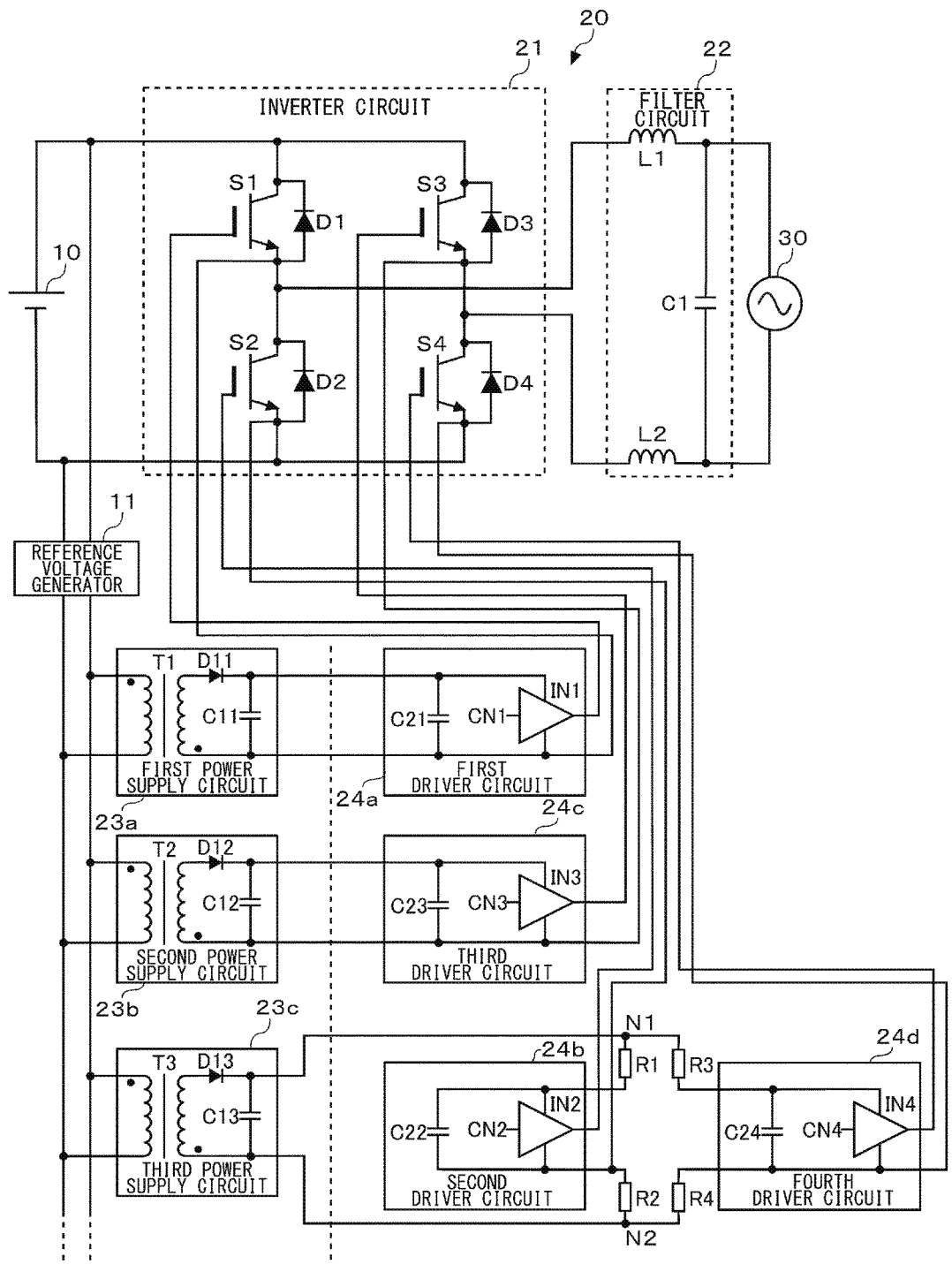
FIG. 4 shows a configuration of the power converter according to embodiment 1 of the present invention.

FIG. 4 shows a configuration of the power converter 20 according to embodiment 1 of the present invention. A description of those features that are common to those of comparative example 1 will be omitted. In embodiment 1, the first switching device S1~fourth switching device S4 and the first driver circuit 24a~fourth driver circuit 24d are mounted on the same substrate (hereinafter, referred to as the first substrate). The first switching device S1~fourth switching device S4 and the first driver circuit 24a~fourth driver circuit 24d may be implemented in an Intelligent Power Module (IPM).

The first power supply circuit 23a~third power supply circuit 23c are mounted on the second substrate separate from the first substrate. This permits a flexible arrangement such as stacking the second substrate on the first substrate in parallel or inserting the second substrate vertically. By employing such an arrangement, the vacant space in the housing of the power converter 20 is effectively used and the size of the housing of the power converter 20 is reduced.

In embodiment 1, the wirings from the second substrate on which the third power supply circuit 23c is provided to the first substrate on which the second driver circuit 24b and the fourth driver circuit 24d are provided are used by the third power supply circuit 23c to supply the power supply voltage commonly to the second driver circuit 24b and the fourth driver circuit 24d. Unlike comparative example 2, the second substrate on which the third power supply circuit 23c is provided is not individually wired to the second driver circuit 24b and to the fourth driver circuit 24d.

A positive side branch node N1 of the positive side wiring from the third power supply circuit 23c and a negative side branch node N2 of the negative side wiring from the third power supply circuit 23c are formed in the first substrate. A first impedance device R1 is connected between the positive side branch node N1 and the positive side power supply terminal of the second driver circuit 24b. A second impedance device R2 is connected between the negative side branch node N2 and the negative side power supply terminal of the second driver circuit 24b. A third impedance device R3 is connected between the positive side branch node N1 and the positive side power supply terminal of the fourth driver circuit 24d. A fourth impedance device R4 is connected between the negative side branch node N2 and the negative side power supply terminal of the fourth driver circuit 24d.

Each of the first impedance device R1~fourth impedance device R4 may be a resistor or an inductor, or a combination thereof. The designer may select an optimal device as appropriate in accordance with experiments or simulations.

As described above, according to the first embodiment, by using a common power supply circuit for the second driver circuit 24b for the second switching device S2 and the fourth driver circuit 24d for the fourth switching device S4, the circuit scale and cost are reduced. Further, two impedance devices are interposed between the emitter terminal of the second switching device S2 and the emitter terminal of the fourth switching device S4 so that the instantaneous current produced by a potential difference between the emitters is reduced. Still further, the negative potentials of the second driver circuit 24b and the fourth driver circuit 24d can vary independently over a larger range. Accordingly, the emitter potential of the second switching device S2 and the negative potential of the second driver circuit 24b can match each other easily, and the emitter potential of the fourth switching device S4 and the negative potential of the fourth driver circuit 24d can match each other easily so that it is difficult for a false operation to occur.

By mounting the first power supply circuit 23a~third power supply circuit 23c on a substrate separate from the substrate on which the first switching device S1~fourth switching device S4 and the first driver circuit 24a~fourth driver circuit 24d are mounted, the flexibility of arrangement of the substrates is increased. Further, by supplying electric power from the third power supply circuit 23c to the second driver circuit 24b and the fourth driver circuit 24d using common wirings, the number of wirings between the first substrate and the second substrate is prevented from increasing. This saves the mounting space of the power converter 20.

Figure 5:
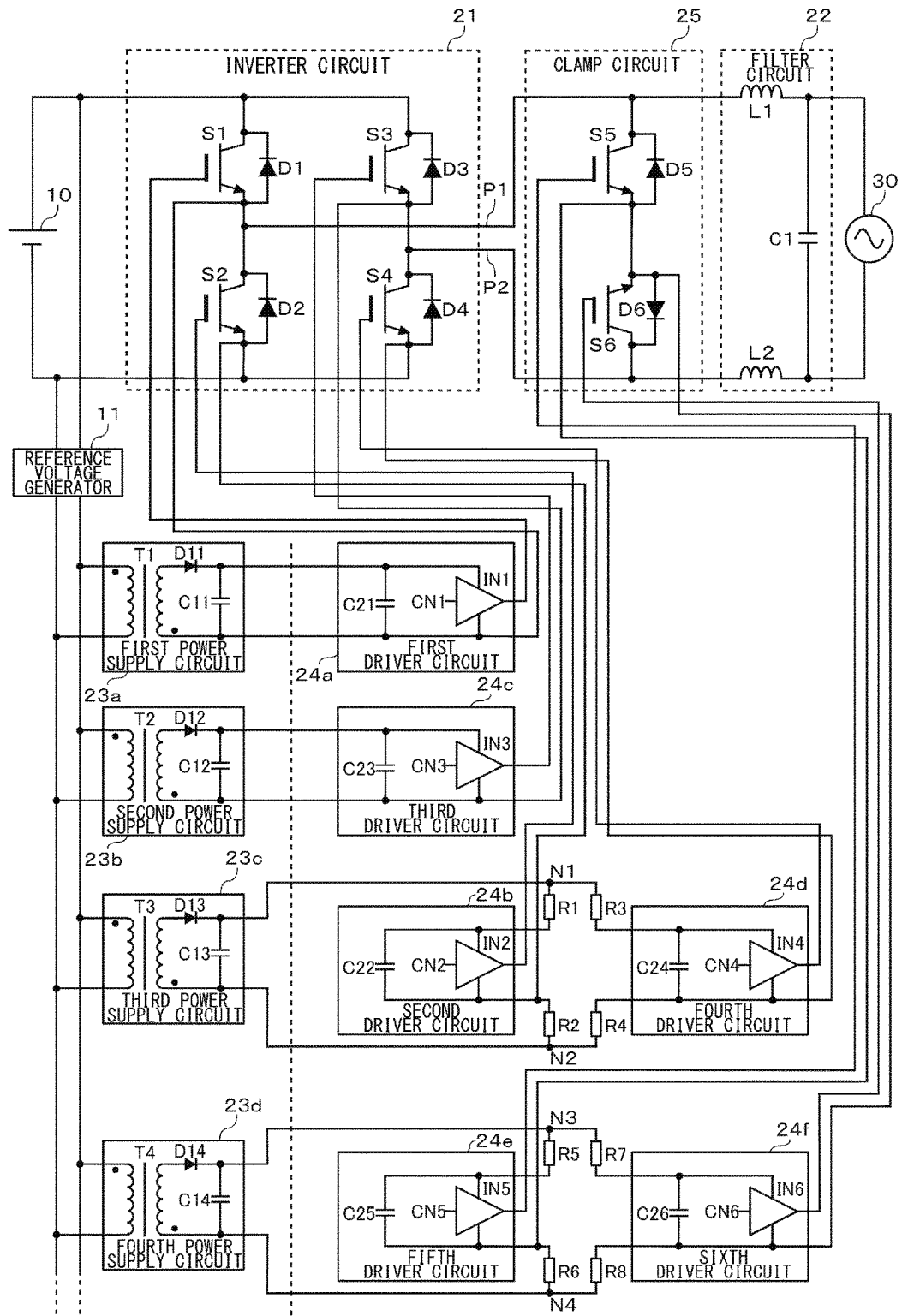
FIG. 5 shows a configuration of the power converter according to embodiment 2 of the present invention.

FIG. 5 shows a configuration of the power converter 20 according to embodiment 2 of the present invention. The power converter 20 according to embodiment 2 is configured such that a clamp circuit 25, a fourth power supply circuit 23d, a fifth driver circuit 24e, and a sixth driver circuit 24f are added to the power converter 20 according to embodiment 1 shown in FIG. 4. The clamp circuit 25 is connected between output lines P1 and P2 of the inverter circuit 21 and is capable of producing a short circuit between the output lines P1 and P2 of the inverter circuit 21 such that the direction of conduction in the short circuit is switchable.

The inverter circuit 21 includes a fifth switching device S5 and a sixth switching device S6 connected in series. The collector terminal of the fifth switching device S5 is connected to the first output line of the inverter circuit 21, the collector terminal of the sixth switching device S6 is connected to the second output line of the inverter circuit 21, and the emitter terminal of the fifth switching device S5 and the emitter terminal of the sixth switching device S6 are connected.

A fifth feedback diode D5 is connected in parallel with the fifth switching device S5 in the direction in which a current flows from the emitter to the collector. A sixth feedback diode D6 is connected in parallel with the sixth switching device S6 in the direction in which a current flows from the emitter to the collector. Therefore, while the fifth switching device S5 is on and the sixth switching device S6 is off, a current flows only in the direction from the first output line to the second output line. While the fifth switching device S5 is off and the sixth switching device S6 is on, a current flows only in the direction from the second output line to the first output line.

The fourth power supply circuit 23d subjects the reference voltage to DC-DC conversion so as to generate a power supply voltage common to the fifth driver circuit 24e and the sixth driver circuit 24f. The fourth power supply circuit 23d is configured similarly as the first power supply circuit 23a.

The fifth driver circuit 24e generates a driving voltage to drive the fifth switching device S5 in accordance with a control signal CN5 for the fifth switching device S5. The sixth driver circuit 24f generates a driving voltage to drive the sixth switching device S6 in accordance with a control signal CN6 for the sixth switching device S6. The fifth driver circuit 24e and the sixth driver circuit 24f are configured similarly as the first driver circuit 24a.

Figure 6:
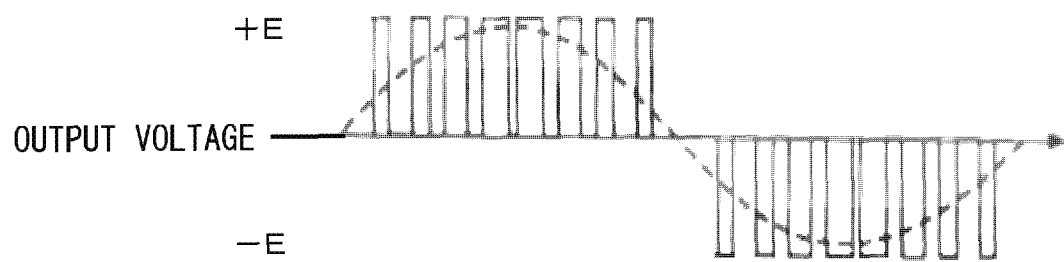
FIG. 6 shows an operation of the power converter according to embodiment 2 of the present invention.

FIG. 6 shows an operation of the power converter 20 according to embodiment 2 of the present invention. During the first half of a cycle, PWM control is performed to cause the first switching device S1 and the fourth switching device S4 to be on and off repeatedly, the second switching device S2 and the third switching device S4 are controlled to be off, the fifth switching device S5 is controlled to be off, and the sixth switching device S6 is controlled to be on.

While the first switching device S1 and the fourth switching device S4 are on, a positive voltage +E is output to the filter circuit 22. While the first switching device S1 and the third switching device S3 are off, the current based on the energy collected in the filter circuit 22 is fed back via the clamp circuit 25 so that the input voltage and the output voltage of the filter circuit 22 are brought to zero.

During the second half of a cycle, PWM control is performed to cause the second switching device S2 and the third switching device S3 to be on and off repeatedly, the first switching device S1 and the fourth switching device S4 are controlled to be off, the fifth switching device S5 is controlled to be on, and the sixth switching device S6 is controlled to be off.

While the second switching device S2 and the third switching device S3 are on, a negative voltage −E is output to the filter circuit 22. While the second switching device S2 and the third switching device S3 are off, the current based on the energy collected in the filter circuit 22 is fed back via the clamp circuit 25 so that the input voltage and the output voltage of the filter circuit 22 are brought to zero. The filter circuit 22 generates a sinusoidal wave (see the dotted line) based on the three levels including the positive voltage +E, zero, and the negative voltage −E.

Reference is made back to FIG. 5. In embodiment 2, the first switching device S1~sixth switching device S6 and the first driver circuit 24a~sixth driver circuit 24f are mounted on the first substrate and the first power supply circuit 23a~fourth power supply circuit 23d are mounted on the second substrate. The wirings from the second substrate on which the fourth power supply circuit 23d is provided to the first substrate on which the fifth driver circuit 24e and the sixth driver circuit 24f are provided are used by the fourth power supply circuit 23d to supply the power supply voltage commonly to the fifth driver circuit 24e and the sixth driver circuit 24f.

A positive side branch node N3 of the positive side wiring from the fifth power supply circuit 23e and a negative side branch node N4 of the negative side wiring from the fifth power supply circuit 23e are formed in the first substrate. A fifth impedance device R5 is connected between the positive side branch node N3 and the positive side power supply terminal of the fifth driver circuit 24e. A sixth impedance device R6 is connected between the negative side branch node N4 and the negative side power supply terminal of the fifth driver circuit 24e. A seventh impedance device R7 is connected between the positive side branch node N3 and the positive side power supply terminal of the sixth driver circuit 24f. An eighth impedance device R8 is connected between the negative side branch node N4 and the negative side power supply terminal of the sixth driver circuit 24f.

As described above, embodiment 2 provides the same advantage as embodiment 1. In further accordance with embodiment 2, the output waveform is configured to be closer to a sinusoidal wave by forming a 3-level inverter by adding the clamp circuit 25. Accordingly, the size of the filter circuit 22 for producing a sinusoidal output waveform is reduced. Still further, the voltage amplitude occurring when the first switching device S1~fourth switching device S4 are switched is reduced to half as compared to the case of the 2-level inverter so that the switching loss is substantially reduced to half. Accordingly, the conversion efficiency is improved and the noise generated from the power converter 20 is also reduced.

By using a common power supply circuit for the fifth driver circuit 24e for the fifth switching device S5 and the sixth driver circuit 24f for the sixth switching device S6, the circuit scale and cost are reduced. Still further, by providing the positive side branch node N3, the negative side branch node N4, and the fifth impedance device R5~eighth impedance device R8 on the first substrate, a false operation of the fifth switching device S5 and the sixth switching device S6 is prevented, while also preventing the number of wirings between the first substrate and the second substrate from increasing.

Figure 7:
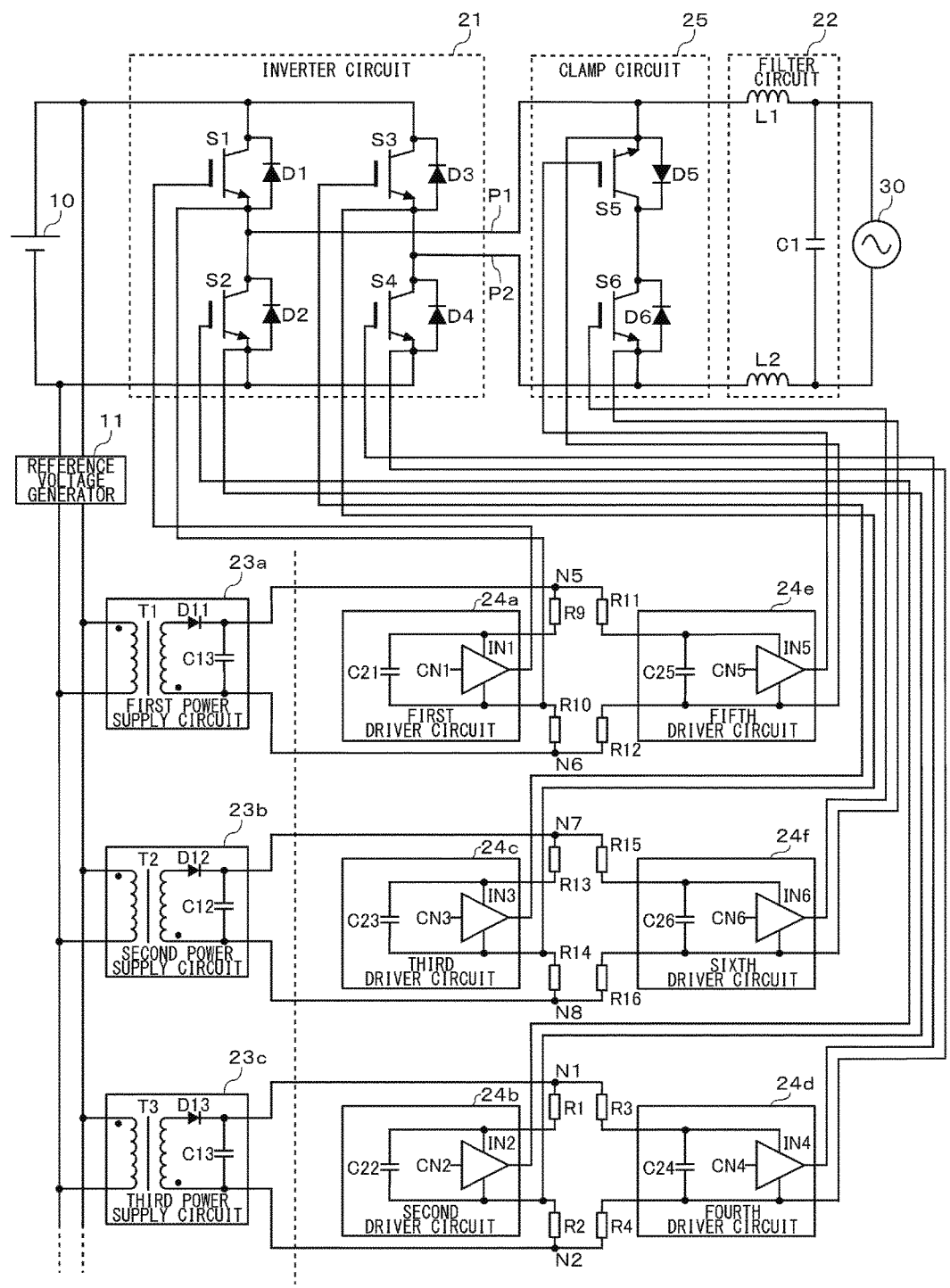
FIG. 7 shows a configuration of the power converter according to embodiment 3 of the present invention.

FIG. 7 shows a configuration of the power converter 20 according to embodiment 3 of the present invention. The power converter 20 according to embodiment 3 is configured such that a clamp circuit 25, a fifth driver circuit 24e, and a sixth driver circuit 24f are added to the power converter 20 according to embodiment 1 shown in FIG. 4. The clamp circuit 25 is connected between output lines P1 and P2 of the inverter circuit 21 and is capable of producing a short circuit between the output lines P1 and P2 of the inverter circuit 21 such that the direction of conduction in the short circuit is switchable.

The inverter circuit 21 includes a fifth switching device S5 and a sixth switching device S6 connected in series. In embodiment 3, the directions of the fifth switching device S5 and the sixth switching device S6 are opposite to those of embodiment 2. In other words, the emitter terminal of the fifth switching device S5 is connected to the first output line of the inverter circuit 21, the emitter terminal of the sixth switching device S6 is connected to the second output line of the inverter circuit 21, and the collector terminal of the fifth switching device S5 and the collector terminal of the sixth switching device S6 are connected.

A fifth feedback diode D5 is connected in parallel with the fifth switching device S5 in the direction in which a current flows from the emitter to the collector. A sixth feedback diode D6 is connected in parallel with the sixth switching device S6 in the direction in which a current flows from the emitter to the collector. Therefore, while the fifth switching device S5 is on and the sixth switching device is off, a current flows only in the direction from the second output line to the first output line. While the fifth switching device S5 is off and the sixth switching device S6 is on, a current flows only in the direction from the first output line to the second output line.

In embodiment 3, the first power supply circuit 23a subjects the reference voltage to DC-DC conversion so as to generate a power supply voltage common to the first driver circuit 24a and the fifth driver circuit 24e. The second power supply circuit 23b subjects the reference voltage to DC-DC conversion so as to generate a power supply voltage common to the third driver circuit 24c and the sixth driver circuit 24f. The operation of the power converter 20 according to embodiment 3 is the same as the operation of the power converter 20 according to embodiment 2 shown in FIG. 6 except that the fifth switching device S5 and the sixth switching device S6 are turned on/off on opposite conditions.

The first switching device S1~sixth switching device S6 and the first driver circuit 24a~sixth driver circuit 24f are mounted on the first substrate and the first power supply circuit 23a~third power supply circuit 23c are mounted on the second substrate. The wirings from the second substrate on which the first power supply circuit 23a is provided to the first substrate on which the first driver circuit 24a and the fifth driver circuit 24e are provided are used by the first power supply circuit 23a to supply the power supply voltage commonly to the first driver circuit 24a and the fifth driver circuit 24e.

A positive side branch node N5 of the positive side wiring from the first power supply circuit 23a and a negative side branch node N6 of the negative side wiring from the first power supply circuit 23a are formed in the first substrate. A ninth impedance device R9 is connected between the positive side branch node N5 and the positive side power supply terminal of the first driver circuit 24a. A tenth impedance device R10 is connected between the negative side branch node N6 and the negative side power supply terminal of the first driver circuit 24a. An eleventh impedance device R11 is connected between the positive side branch node N5 and the positive side power supply terminal of the fifth driver circuit 24e. A twelfth impedance device R12 is connected between the negative side branch node N6 and the negative side power supply terminal of the fifth driver circuit 24e.

The wirings from the second substrate on which the second power supply circuit 23b is provided to the first substrate on which the third driver circuit 24c and the sixth driver circuit 24f are provided are used by the second power supply circuit 23b to supply the power supply voltage commonly to the third driver circuit 24c and the sixth driver circuit 24f.

A positive side branch node N7 of the positive side wiring from the second power supply circuit 23b and a negative side branch node N8 of the negative side wiring from the second power supply circuit 23b are formed in the first substrate. A thirteenth impedance device R13 is connected between the positive side branch node N7 and the positive side power supply terminal of the third driver circuit 24c. A fourteenth impedance device R14 is connected between the negative side branch node N8 and the negative side power supply terminal of the third driver circuit 24c. A fifteenth impedance device R15 is connected between the positive side branch node N7 and the positive side power supply terminal of the sixth driver circuit 24f. An sixteenth impedance device R16 is connected between the negative side branch node N8 and the negative side power supply terminal of the sixth driver circuit 24f.

As described above, embodiment 3 provides the same advantage as embodiment 2. In further accordance with embodiment 3, it is possible to supply power to six driver circuits from three power supply circuits, by using a common power supply circuit for the first driver circuit 24a for the first switching device S1 and for the fifth driver circuit 24e for the fifth switching device S5, and by using a common power power supply circuit for the third driver circuit 24c for the third switching device S3 and for the sixth driver circuit 24f for the sixth switching device S6.

According to the configuration of embodiment 3, the emitter terminal of the first switching device S1 and the emitter terminal of the fifth switching device S5 are connected by a high current path, and the emitter terminal of the third switching device S3 and the emitter terminal of the sixth switching device S6 are connected by a high current path. Therefore, a potential difference larger than the potential difference between the emitter terminal of the fifth switching device S5 and the emitter terminal of the sixth switching device S6 according embodiment 2 tends to be produced but the impact from this potential difference is mitigated by providing the ninth impedance device R9~sixteenth impedance device R16.

Described above is an explanation based on an exemplary embodiment. The embodiment is intended to be illustrative only and it will be obvious to those skilled in the art that various modifications to constituting elements and processes could be developed and that such modifications are also within the scope of the present invention.

In the above description, it is assumed to use IGBTs as switching devices. Alternatively, MOSFETs may be used. In that case, "emitter" should read "source" and "collector" should read "drain".

In the above description, an inverter circuit 21 for converting a DC power into a single-phase AC power is assumed. The inventive technology can also be applied to an inverter circuit for converting a DC power into a three-phase AC power. In that case, a common power supply circuit is used for the three driver circuits that drive the three switching devices on the lower side. The positive side branch node provided in the first substrate is connected to the positive side power supply terminal of the three driver circuits via respective impedance devices, and the negative side branch node is connected to the negative side power supply terminal of the three driver circuits via respective impedance devices.

The embodiments may be defined by the following items.

[Item 1]

A power converter (20) comprising:

an inverter circuit (21) including a first arm and a second arm connected in parallel and converting a DC power into an AC power, the first arm including a first switching device (S1) and a second switching device (S2) connected in series, the second arm including a third switching device (S3) and a fourth switching device (S4) connected in series;

a first power supply circuit (23a) that subjects a reference voltage to DC-DC conversion to generate a power supply voltage for a first driver circuit (24a) for driving the first switching device (S1);

a second power supply circuit (23b) that subjects the reference voltage to DC-DC conversion to generate a power supply voltage for a third driver circuit (24c) for driving the third switching device (S3);

a third power supply circuit (23c) that subjects the reference voltage to DC-DC conversion to generate a power supply voltage common to a second driver circuit (24b) for driving the second switching device (S2) and a fourth driver circuit (24d) for driving the fourth switching device (S4), wherein wirings from a substrate on which the third power supply circuit (23c) is provided to a substrate on which the second driver circuit (24b) and the fourth driver circuit (24d) are provided are used by the third power supply circuit (23c) to supply the power supply voltage commonly to the second driver circuit (24b) and the fourth driver circuit (24d), the substrate on which the second driver circuit (24b) and the fourth driver circuit (24d) are provided includes:

a positive side branch node (N1) of the wirings;

a negative side branch node (N2) of the wirings;

a first impedance device (R1) connected to the positive side branch node (N1) and a positive side power supply terminal of the second driver circuit (24b);

a second impedance device (R2) connected to the negative side branch node (N2) and a negative side power supply terminal of the second driver circuit (24b);

a third impedance device (R3) connected to the positive side branch node (N1) and a positive side power supply terminal of the fourth driver circuit (24d); and a fourth impedance device (R4) connected to the negative side branch node (N2) and a negative side power supply terminal of the fourth driver circuit (24d).

According to this, a common power supply circuit is used for the second driver circuit (24b) for the second switching device (S2) and the second driver circuit (24b) for the fourth switching device (S4), while also inhibiting a false operation of the second switching device (S2) and the fourth switching device (S4).

[Item 2]

The power converter (20) according to Item 1, wherein the third power supply circuit (23c) includes an insulated DC-DC converter that steps down the reference voltage.

According to this, the power supply voltage for the second driver circuit (24b) and the fourth driver circuit (24d) can be generated from the reference voltage while also securing insulation.

[Item 3]

The power converter (20) according to Item 1 or Item 2, further comprising:

a clamp circuit (25) in which a fifth switching device (S5) and a sixth switching device (S6) are inserted in series between output lines (P1, P2) of the inverter circuit (21) such that emitter terminals or source terminals of the fifth switching device (S5) and the sixth switching device (S6) are connected to each other; and a fourth power supply circuit (23d) that subjects the reference voltage to DC-DC conversion so as to generate a power supply voltage common to a fifth driver circuit (24e) for driving the fifth switching device (S5) and a sixth switching device (S6) for driving the sixth switching device (S6), wherein wirings from a substrate on which the fourth power supply circuit (23d) is provided to a substrate on which the fifth driver circuit (24e) and the sixth driver circuit (24f) are provided are used by the fourth power supply circuit (23d) to supply the power supply voltage commonly to the fifth driver circuit (24e) and the sixth driver circuit (24f), the substrate on which the fifth driver circuit (24e) and the sixth driver circuit (24f) are provided includes:

a positive side branch node (N3) of the wirings from the fourth power supply circuit (23d);

a negative side branch node (N4) of the wirings from the fourth power supply circuit (23d);

a fifth impedance device (R5) connected to the positive side branch node (N3) and a positive side power supply terminal of the fifth driver circuit (24e);

a sixth impedance device (R6) connected to the negative side branch node (N4) and a negative side power supply terminal of the fifth driver circuit (24e);

a seventh impedance device (R7) connected to the positive side branch node (N3) and a positive side power supply terminal of the sixth driver circuit (24f); and an eighth impedance device (R8) connected to the negative side branch node (N8) and a negative side power supply terminal of the sixth driver circuit (24f).

According to this, a common power supply circuit is used for the fifth driver circuit (24e) for the fifth switching device (S5) forming the three-level clamp circuit (25) and for the sixth driver circuit (24f) for the sixth switching device (S6) also forming the three-level clamp circuit (25), while also inhibiting a false operation of the fifth switching device (S5) and the sixth switching device (S6).

[Item 4]

The power converter (20) according to Item 1 or Item 2, further comprising:

a clamp circuit (25) in which a fifth switching device (S5) and a sixth switching device (S6) are inserted in series between output lines (P1, P2) of the inverter circuit (21) such that collector terminals or drain terminals of the fifth switching device (S5) and the sixth switching device (S6) are connected to each other, wherein the first power supply circuit (23a) generates a power supply voltage common to the first driver circuit (24a) and a fifth driver circuit (24e) for driving the fifth switching device (S5), the second power supply circuit (23b) generates a power supply voltage common to the third driver circuit (24c) and a sixth driver circuit (24f) for driving the sixth switching device (S6), wirings from a substrate on which the first power supply circuit (23a) is provided to a substrate on which the first driver circuit (24a) and the fifth driver circuit (24e) are provided are used by the first power supply circuit (23a) to supply the power supply voltage commonly to the first driver circuit (24a) and the fifth driver circuit (24e), wirings from a substrate on which the second power supply circuit (23b) is provided to a substrate on which the third driver circuit (24c) and the sixth driver circuit (24f) are provided are used by the second power supply circuit (23b) to supply the power supply voltage commonly to the third driver circuit (24c) and the sixth driver circuit (24f), the substrate on which the first driver circuit (24a) and the fifth driver circuit (24f) are provided includes:

a positive side branch node (N5) of the wirings from the first power supply circuit (23a);

a negative side branch node (N6) of the wirings from the first power supply circuit (23a);
a ninth impedance device (R9) connected to the positive side branch node (N5) and a positive side power supply terminal of the first driver circuit (24a);
a tenth impedance device (R10) connected to the negative side branch node (N6) and a negative side power supply terminal of the first driver circuit (24a);
an eleventh impedance device (R11) connected to the positive side branch node (N5) and a positive side power supply terminal of the fifth driver circuit (24e); and
a twelfth impedance device (R12) connected to the negative side branch node (N6) and a negative side power supply terminal of the fifth driver circuit (24e), and
the substrate on which the third driver circuit (24c) and the sixth driver circuit (24f) are provided includes:
a positive side branch node (N7) of the wirings from the second power supply circuit (23b);
a negative side branch node (N8) of the wirings from the second power supply circuit (23b);
a thirteenth impedance device (R13) connected to the positive side branch node (N7) and a positive side power supply terminal of the third driver circuit (24c);
a fourteenth impedance device (R14) connected to the negative side branch node (N8) and a negative side power supply terminal of the third driver circuit (24c);
a fifteenth impedance device (R15) connected to the positive side branch node (N7) and a positive side power supply terminal of the sixth driver circuit (24f); and
a sixteenth impedance device (R16) connected to the negative side branch node (N8) and a negative side power supply terminal of the sixth driver circuit (24f).
According to this, it is possible for three power supply circuits (23a~23c) to generate a power supply voltage for six driver circuits (24a~24f) for six switching devices (S1~S6) of the 3-level inverter, while also inhibiting a false operation of the six switching device (S1~S6).

What is claimed is:

1. A power converter comprising:
an inverter circuit including a first arm and a second arm connected in parallel and converting a DC power into an AC power, the first arm including a first switching device and a second switching device connected in series, the second arm including a third switching device and a fourth switching device connected in series;
a first power supply circuit that subjects a reference voltage to DC-DC conversion to generate a power supply voltage for a first driver circuit for driving the first switching device;
a second power supply circuit that subjects the reference voltage to DC-DC conversion to generate a power supply voltage for a third driver circuit for driving the third switching device;
a third power supply circuit that subjects the reference voltage to DC-DC conversion to generate a power supply voltage common to a second driver circuit for driving the second switching device and a fourth driver circuit for driving the fourth switching device, wherein
wirings from a substrate on which the third power supply circuit is provided to a substrate on which the second driver circuit and the fourth driver circuit are provided are used by the third power supply circuit to supply the power supply voltage commonly to the second driver circuit and the fourth driver circuit,
the substrate on which the second driver circuit and the fourth driver circuit are provided includes:
a positive side branch node of the wirings;
a negative side branch node of the wirings;
a first impedance device connected to the positive side branch node and a positive side power supply terminal of the second driver circuit;
a second impedance device connected to the negative side branch node and a negative side power supply terminal of the second driver circuit;
a third impedance device connected to the positive side branch node and a positive side power supply terminal of the fourth driver circuit; and
a fourth impedance device connected to the negative side branch node and a negative side power supply terminal of the fourth driver circuit.

2. The power converter according to claim 1, wherein the third power supply circuit includes an insulated DC-DC converter that steps down the reference voltage.

3. The power converter according to claim 1, further comprising:
a clamp circuit in which a fifth switching device and a sixth switching device are inserted in series between output lines of the inverter circuit such that emitter terminals or source terminals of the fifth switching device and the sixth switching device are connected to each other; and
a fourth power supply circuit that subjects the reference voltage to DC-DC conversion so as to generate a power supply voltage common to a fifth driver circuit for driving the fifth switching device and a sixth switching device for driving the sixth switching device, wherein
wirings from a substrate on which the fourth power supply circuit is provided to a substrate on which the fifth driver circuit and the sixth driver circuit are provided are used by the fourth power supply circuit to supply the power supply voltage commonly to the fifth driver circuit and the sixth driver circuit,
the substrate on which the fifth driver circuit and the sixth driver circuit are provided includes:
a positive side branch node of the wirings from the fourth power supply circuit;
a negative side branch node of the wirings from the fourth power supply circuit;
a fifth impedance device connected to the positive side branch node and a positive side power supply terminal of the fifth driver circuit;
a sixth impedance device connected to the negative side branch node and a negative side power supply terminal of the fifth driver circuit;
a seventh impedance device connected to the positive side branch node and a positive side power supply terminal of the sixth driver circuit; and
an eighth impedance device connected to the negative side branch node and a negative side power supply terminal of the sixth driver circuit.

4. The power converter according to claim 1, further comprising:
a clamp circuit in which a fifth switching device and a sixth switching device are inserted in series between output lines of the inverter circuit such that collector terminals or drain terminals of the fifth switching device and the sixth switching device are connected to each other, wherein
the first power supply circuit generates a power supply voltage common to the first driver circuit and a fifth driver circuit for driving the fifth switching device, the second power supply circuit generates a power supply voltage common to the third driver circuit and a sixth driver circuit for driving the sixth switching device, wirings from a substrate on which the first power supply circuit is provided to a substrate on which the first driver circuit and the fifth driver circuit are provided are used by the first power supply circuit to supply the power supply voltage commonly to the first driver circuit and the fifth driver circuit, wirings from a substrate on which the second power supply circuit is provided to a substrate on which the third driver circuit and the sixth driver circuit are provided are used by the second power supply circuit to supply the power supply voltage commonly to the third driver circuit and the sixth driver circuit, the substrate on which the first driver circuit and the fifth driver circuit are provided includes:

a positive side branch node of the wirings from the first power supply circuit;

a negative side branch node of the wirings from the first power supply circuit;

a ninth impedance device connected to the positive side branch node and a positive side power supply terminal of the first driver circuit;

a tenth impedance device connected to the negative side branch node and a negative side power supply terminal of the first driver circuit;

an eleventh impedance device connected to the positive side branch node and a positive side power supply terminal of the fifth driver circuit; and a twelfth impedance device connected to the negative side branch node and a negative side power supply terminal of the fifth driver circuit, and the substrate on which the third driver circuit and the sixth driver circuit are provided includes:

a positive side branch node of the wirings from the second power supply circuit;

a negative side branch node of the wirings from the second power supply circuit;

a thirteenth impedance device connected to the positive side branch node and a positive side power supply terminal of the third driver circuit;

a fourteenth impedance device connected to the negative side branch node and a negative side power supply terminal of the third driver circuit;

a fifteenth impedance device connected to the positive side branch node and a positive side power supply terminal of the sixth driver circuit; and a sixteenth impedance device connected to the negative side branch node and a negative side power supply terminal of the sixth driver circuit.

* * * * *